US011605886B1

(12) United States Patent
Refai-Ahmed et al.

(10) Patent No.: US 11,605,886 B1
(45) Date of Patent: Mar. 14, 2023

(54) RADOME WITH INTEGRATED PASSIVE COOLING

(71) Applicant: XILINX, INC., San Jose, CA (US)

(72) Inventors: Gamal Refai-Ahmed, Santa Clara, CA (US); Chi-Yi Chao, New Taipei (TW); Lik Tsang, Kowloon (HK); Jens Weis, Dresden (DE); Brendan Farley, Dublin (IE); Anthony Torza, Oakland, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 53 days.

(21) Appl. No.: 17/133,518

(22) Filed: Dec. 23, 2020

(51) Int. Cl.
*H01Q 1/42* (2006.01)
*H01L 23/427* (2006.01)
*H01Q 1/02* (2006.01)

(52) U.S. Cl.
CPC ............. *H01Q 1/42* (2013.01); *H01L 23/427* (2013.01); *H01Q 1/02* (2013.01)

(58) Field of Classification Search
CPC .................................. H01Q 1/42; H01Q 1/02
See application file for complete search history.

(56) References Cited

U.S. PATENT DOCUMENTS

| 5,406,698 | A |   | 4/1995  | Lipinski |
|-----------|---|---|---------|----------|
| 5,825,087 | A |   | 10/1998 | Iruvanti et al. |
| 6,259,933 | B1| * | 7/2001  | Bambridge ............... H04B 1/38 |
|           |   |   |         | 343/702 |
| 6,437,437 | B1|   | 8/2002  | Zuo et al. |
| 6,437,438 | B1|   | 8/2002  | Braasch |
| 6,607,942 | B1|   | 8/2003  | Tsao et al. |
| 7,491,577 | B2|   | 2/2009  | Sturcken et al. |
| 9,287,141 | B2|   | 3/2016  | Dahlstrom |

(Continued)

FOREIGN PATENT DOCUMENTS

| FR | 3045143 A1 | * | 6/2017 | ............. G21F 5/002 |
| JP | 202098064 A | * | 6/2020 | ................ F28F 1/32 |

OTHER PUBLICATIONS

Ventola, L. et al., "Micro-structured rough surfaces by laser etching for heat transfer", Journal of Physics: Conference Series 525 (2014) 012017, Eurotherm Seminar 102: Thermal Management of Electronic Systems, IOP Publishing, 10 pgs., retrieved Mar. 21, 2017 from URL:http://iopscience.iop.org/article/10.1088/1742-6596/525/1/012017/pdf.

(Continued)

*Primary Examiner* — Hoang V Nguyen
(74) *Attorney, Agent, or Firm* — Patterson + Sheridan, LLP

(57) ABSTRACT

An antenna assembly is provided having passive cooling elements that enable compact design. In one example, an antenna assembly is provided that includes a heat sink assembly having an interior side and an exterior side, an antenna array, an antenna circuit board, and a radome. The antenna circuit board includes at least one integrated circuit (IC) die. The IC die has a conductive primary heat dissipation path to the interior side of the heat sink assembly. The radome is coupled to the heat sink assembly and encloses the antenna circuit board and the antenna array between the radome and the heat sink assembly. The heat sink assembly includes a metal base plate and at least a first heat pipe embedded with the metal base plate. The first heat pipe is disposed between the metal base plate and the IC die.

21 Claims, 5 Drawing Sheets

(56) References Cited

U.S. PATENT DOCUMENTS

| | | |
|---|---|---|
| 9,418,909 B1 | 8/2016 | Chaware et al. |
| 9,812,374 B1 | 11/2017 | Refai-Ahmed et al. |
| 10,043,730 B2 | 8/2018 | Refai-Ahmed et al. |
| 10,262,920 B1 | 4/2019 | Refai-Ahmed et al. |
| 2005/0201061 A1* | 9/2005 | Nikfar ............... H05K 7/20336 165/104.33 |
| 2006/0227510 A1 | 10/2006 | Fitzgerald et al. |
| 2006/0238984 A1 | 10/2006 | Belady et al. |
| 2008/0274349 A1 | 11/2008 | Chiu et al. |
| 2013/0168844 A1 | 7/2013 | Stanley et al. |
| 2014/0264820 A1 | 9/2014 | Hu et al. |
| 2015/0279761 A1 | 10/2015 | Bet-Shliemoun |

OTHER PUBLICATIONS

Conard Corporation, "Photo Etching PCB Heatsinks", retrieved Mar. 21, 2017 from URL: http://www.conardcorp.com/photo-etched-heatsinks.

* cited by examiner

RADOME WITH INTEGRATED PASSIVE COOLING

TECHNICAL FIELD

Embodiments of the present invention generally relate to a radome having integrated passive cooling.

BACKGROUND

As wireless communications evolve from 4G to 5G mobile networks, massive-element antenna assemblies have been employed to enable network transmissions at ultra-high speeds with ultra-low latency. However, massive-element antennas generate large amounts of heat within the antenna assembly due to the increased power consumption associated with the large number of analog devices present within the antenna assembly. To compensate for the increased heat associated with the increase in power, larger heat sinks can be utilized to dissipate the large heat load. However, the use of large heat sinks correspondingly requires an increase in the size and cost of the antenna assembly. As 5G mobile networks require an increased number of antenna assemblies, the increase in size and cost as compared to a 4G antenna assembly is highly undesirable.

Thus, there is a new for an improved antenna assembly capable to efficiently handle heat loads generated by massive-element antennas devices.

SUMMARY

An antenna assembly is provided with passive cooling elements that enable a compact, high-performance and cost-effective design. In one example, an antenna assembly is provided that includes a heat sink assembly having an interior side and an exterior side, an antenna array, an antenna circuit board, and a radome. The antenna circuit board includes at least one integrated circuit (IC) die. The IC die has a conductive primary heat dissipation path to the interior side of the heat sink assembly. The radome is coupled to the heat sink assembly and encloses the antenna circuit board and the antenna array between the radome and the heat sink assembly. The heat sink assembly includes a metal base plate and at least a first heat pipe embedded with the metal base plate. The first heat pipe is disposed between the metal base plate and the IC die.

In another example, an antenna assembly is provided that includes a heat sink assembly having an interior side and an exterior side, an antenna array, an antenna circuit board, and a radome. The antenna circuit board includes at least one integrated circuit (IC) die. The IC die has a conductive primary heat dissipation path to the interior side of the heat sink assembly. The radome is coupled to the heat sink assembly and encloses the antenna circuit board and the antenna array between the radome and the heat sink assembly. The heat sink assembly includes a metal base plate, at least a first heat pipe embedded with the metal base plate, and a plurality of fins extending from a first side of the base plate that forms the exterior side of the heat sink assembly. The first heat pipe is disposed between the metal base plate and the IC die. The plurality of fins are arranged in multiple chevron-shaped rows. The chevron-shaped rows are arranged to form an air channel passing through at least two adjacent chevron-shaped rows.

In yet another example, an antenna assembly is provided that includes a heat sink assembly having an interior side and an exterior side, an antenna array, an antenna circuit board, and a radome. The antenna circuit board includes at least one integrated circuit (IC) die. The IC die has a conductive primary heat dissipation path to the interior side of the heat sink assembly. The radome is coupled to the heat sink assembly and encloses the antenna circuit board and the antenna array between the radome and the heat sink assembly. The heat sink assembly includes a base plate, at least a first heat pipe and a second heat pipe embedded with the base plate, and a plurality of fins extending from a first side of the base plate that forms the exterior side of the heat sink assembly. The first and second heat pipes each having an end disposed between the metal base plate and the IC die. The metal base plate has a plurality of grooves formed in a region of the base plate directly over the IC die. Thermal interface material is disposed in contact with at least some of the plurality of grooves formed in the base plate and the IC die, the thermal interface material having suspended conductive particles. The plurality of fins are arranged in multiple chevron-shaped rows. The chevron-shaped rows are arranged to form an air channel passing through at least two adjacent chevron-shaped rows. A plurality of thermally conductive plates extend from the plurality of fins.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples of an antenna assembly are described below that utilize a heat sink assembly with integrated passive cooling to provide enhanced temperature management of solid state components within the antenna assembly. The passive cooling integrated with the heat sink assembly is in the form of one or more heat pipes. The heat pipes are arranged to transfer heat laterally away from the integrated circuit (IC) dies disposed within the antenna assembly so that heat may be dissipated more efficiently across a greater area of the heat sink assembly. Advantageously, the efficient heat dissipation allows the use of a large number electrical devices within the antenna assembly, thus enabling greater processing speeds and ultra-low latency without the need for large heat sinks as would be required in conventional devices. Thus, the efficient thermal management enables robust and reliable performance of massive-element antennas utilized by next generation (e.g., 5G) mobile communication devices without a corresponding need for increase antenna assembly footprint or cost. Moreover, the improved thermal management of the active components and circuits of the antenna assembly allow for a more compact antenna design, thus enabling a smaller and more desirable antenna footprint, while making cooling simpler and improving the service life.

Figure 1:
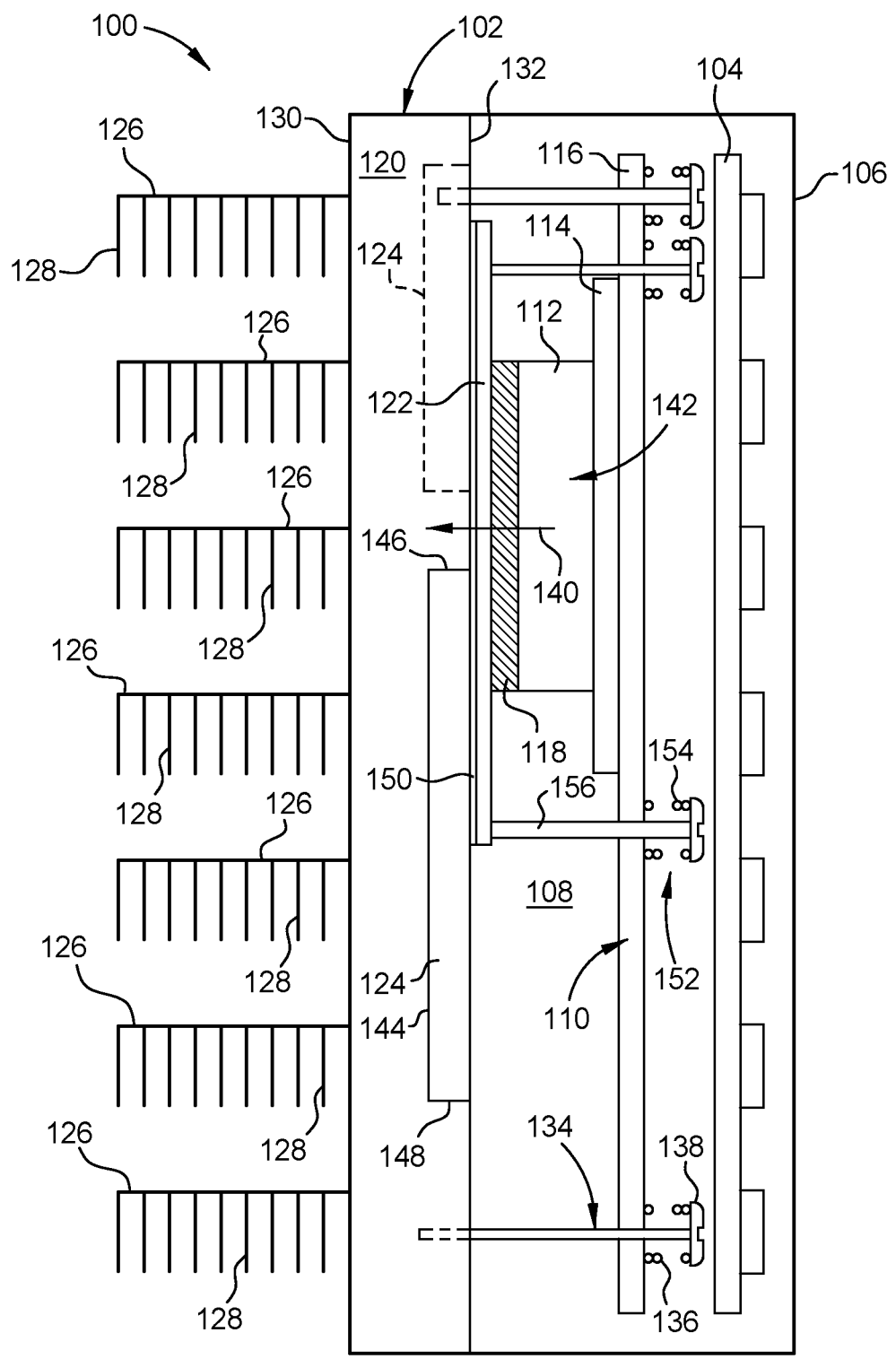
FIG. 1 is a schematic sectional view of an antenna assembly having a heat sink assembly with passive cooling.

Turning now to FIG. 1, a schematic sectional view of one example of an antenna assembly 100 having a heat sink assembly 102 is illustrated. The heat sink assembly 102 is configured with one or more passive cooling elements that enhance the heat transfer capacity of the heat sink assembly 102 with little significant impact to the overall size and weight of the antenna assembly 100. The enhanced heat transfer capacity allow for a compact and lightweight antenna assembly, which is particularly beneficial for massive-element antenna assemblies that enable ultra-high speed, ultra-low latency network transmissions.

In addition to the heat sink assembly 102, the antenna assembly 100 also includes a radome 106, an antenna array 104 and an antenna circuit board 110. The radome 106 is sealingly coupled to the heat sink assembly 102, forming a sealed interior volume 108 in which the antenna array 104 and the antenna circuit board 110 are disposed. The heat sink assembly 102 includes an exterior surface 130 and an interior surface 132. The exterior surface 130 heat sink assembly 102, along with the exterior surface of the radome 106 provide the weather protection for the antenna assembly 100, thus protecting the antenna array 104 and the antenna circuit board 110 disposed in the interior volume 108 from the harsh elements of the outside environment.

The radome 106 is generally fabricated from a material suitable for outdoor use and has a suitable radio frequency (RF) transmission properties, while providing sufficient structural rigidity to inhibit excessive deflection due to wind loading. Suitable materials include, but are not limited to, glass reinforced plastics, thermoplastic compounds, fiberglass, and UV stabilized plastics, such as outdoor grade polyvinyl chloride (PVC).

The antenna array 104 is disposed within the interior volume 108 adjacent to the radome 106. The antenna array 104 may be coupled to either the heat sink assembly 102 or the radome 106, for example by fasteners or clips. In one example, the antenna array 104 is coupled to the radome 106 utilizing a plurality of fasteners.

The antenna array 104 includes a plurality of connectors (not shown), which are configured to couple with one end of an RF connector. The RF connector may be a coaxial cable or other suitable board-to-board connector. The RF connector may be a bullet adapter, such as available from Amphenol RF, that are configured to couple a plurality of connectors of the antenna circuit board 110 with the plurality of connectors of the antenna array 104. The bullet adapter allows the radome 106 to be assembled and mounted to the heat sink assembly 102 while providing tolerance for good and reliable communication between the antenna circuit board 110 and the antenna array 104 through the RF connector.

An optional RF shield (not shown) may also be disposed between the antenna array 104 and the antenna circuit board 110. The RF shield is configured to reduce or block the transfer of radio frequency electromagnetic radiation between the antenna array 104 and the antenna circuit board 110. The RF shield is fabricated from conductive or magnetic materials to form a Faraday cage. Although not shown, the RF shield is coupled via a conductor to the ground of the antenna assembly 100.

The antenna array 104 generally includes a radiating surface and a backside surface. The backside surface generally faces the antenna circuit board 110. The radiating surface has the radiating elements mounted thereon. In one example, radiating elements are arranged in an 8×8 array on the radiating surface. The radiating elements may alternatively different in number and/or arrangement. The radiating element is generally a metal patch configured to communicate signals on a wireless or mobile network, such as 4G and 5G networks. In one example, the radiating elements are arranged to form a phased array of beam-forming antenna elements.

The antenna circuit board 110 generally includes a printed circuit board (PCB) 116 to which at least one chip package 142 is mounted. The chip package 142 includes at least one integrated circuit (IC) die 112 electrically and mechanically mounted to a package substrate 114. An optionally interposer (not shown) maybe disposed between the IC die 112 and the package substrate 114. The package substrate 114 is electrically and mechanically mounted to to the PCB 116 utilizing solder balls (not shown) or other suitable connection.

Although only one chip package 142 having a single IC die 112 is illustrated in FIG. 1, two to as many chip packages 142 as may fit on the PCB 116 may utilized as needed. Additionally the one or more chip packages 142 each may have one IC die 112 to as many IC dies 112 as may fit within each chip package 142 as needed.

The antenna circuit board 110 generally includes passive circuit components (not shown), control circuitry, a power supply, and an array of transceivers. The control circuitry and the array of transceivers may be embodied on the circuitry of the one or more IC dies 112 of the one or more chip packages 142 mounted to the PCB 116.

The control circuitry residing in the IC die(s) 112 is coupled to the power supply and to the transceivers residing in the IC die(s). The control circuitry is also coupled to one or more data ports formed on the PCB 116. The data ports enable the antenna assembly 100 to communicate with an external electronic device, such as a base band unit of a cell site. The control circuitry residing in the IC die 112 also includes processors or other digital logic for processing signals that may be produced and/or received by the antenna array 104.

The power supply is similarly coupled to the control circuitry and to the transceiver. The power supply is also coupled to one or more power ports formed on the PCB 116. The power ports allow the antenna assembly 100 to received power from an external power source, such as a generator or the electrical grid.

The transceivers are coupled to the power supply, the control circuitry and the antenna array 104. The transceivers include circuitry having at least one or more of digital-to-analog converters (DAC), analog-to-digital converters (ADC), filters, modulators and high-performance RF front ends. The RF front ends are coupled to the individual radiating elements of the antenna array.

The exposed surface of the IC die 112 faces the heat sink assembly 102 and faces way from the package substrate 114. Thermal interface material (TIM) 118 is disposed between the IC die 112 and the heat sink assembly 102 such that a primary conductive heat transfer path 140 is established from the IC die 112, through the TIM 118 to the heat sink assembly 102. The TIM 118 may be a thermal gel, thermal epoxy, thermal grease, thermally conductive epoxy, phase-change materials (PCMs), conductive tapes, and silicone-coated fabrics among other suitable materials. The primary conductive heat transfer path 140 is the main route through which heat is removed from the IC die 112 to the heat sink assembly 102, thus enabling thermal regulation of the chip package 142.

Optionally, a thermally conductive heat spreader 122 may be disposed in the conductive heat transfer path 140 defined between the IC die 112 to the heat sink assembly 102 to promote heat transfer. The thermally conductive heat spreader 122 is generally fabricated from a thermally conductive material. In one example, the conductive heat spreader 122 is a plate fabricated from a metal, such as copper, aluminum, stainless steel or the like. In the example depicted in FIG. 1, TIM 118 is disposed between and in contact with both the thermally conductive heat spreader 122 may be disposed in the conductive heat transfer path 140 defined between the IC die 112.

Figure 2A:
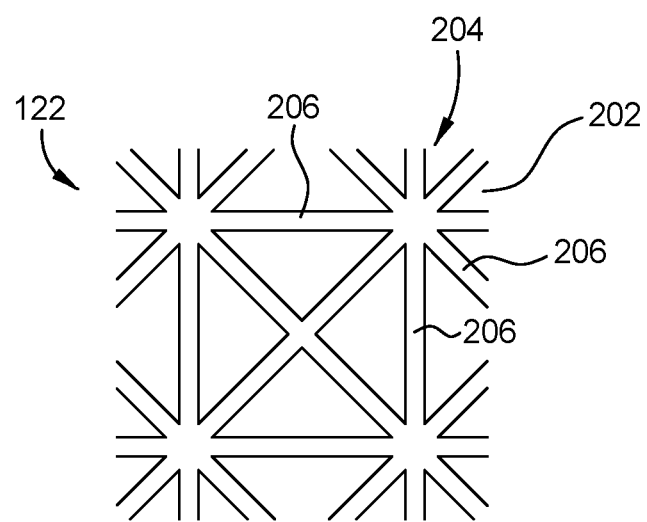
FIG. 2A is a partial plan view of a conductive heat spreader utilized within the antenna assembly illustrating a textured surface.

FIG. 2A is a partial plan view of a side 202 of the conductive heat spreader 122 that faces the IC die 112. The side 202 of the conductive heat spreader 122 is in contact with the TIM 118. The side 202 of the conductive heat spreader 122 generally includes a textured surface 204. The textured surface 204 has multiple grooves 206 in an otherwise relatively flat surface that forms the side 202 of the heat spreader 122. In the example depicted in FIG. 2A, the grooves 206 are arranged in rows, columns, and diagonals intersecting with the rows and columns. It is contemplated that the grooves 206 may have other arrangements, such as only rows, only columns, a grid, spirals, waves, or other configurations.

The textured surface 204 is designed, in conjunction with the TIM 118, to push any gas bubbles out of the flat areas present between the heat spreader 122 and the IC die 112 such that the gas bubbles are trapped in the grooves 206 or driven out of the interface between the heat spreader 122 and the IC die 112 altogether. The area of the grooves 206 is small relative to the ungrooved areas (i.e., the flat areas) of textured surface 204 such that when the gas bubbles are trapped in the grooved areas, the ungrooved areas of the textured surface 204 transfer heat more effectively. With the area of the regions of the flat portions of the textured surface 204 being substantially greater than the area of the regions for the grooves 206, the textured surface 204 provides lower thermal resistance, increase thermal conductivity, and increase heat transfer from the IC die 112 to the heat spreader 122 and ultimately to heat sink assembly 102, which enables better and more reliable performance of the chip package 142.

Figure 2B:
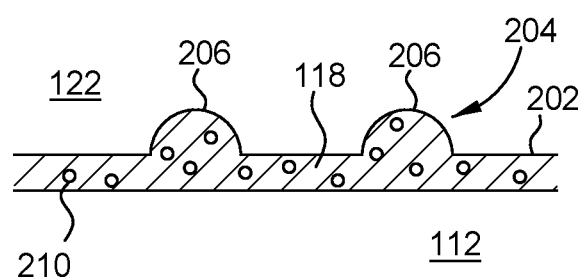
FIG. 2B is a partial sectional view of the textured surface of the conductive heat spreader of FIG. 2A.

FIG. 2B is a partial sectional view of the side 202 of the conductive heat spreader 122 interfacing with the TIM 118. In the example depicted in FIG. 3, the TIM 118 includes suspended particles 210. The particles 210 may be a mixture of one or more polymers and metal particles. For some examples, the particles 210 may have a diameter of 25 μm or less.

In one example, the TIM 118 may exhibit physical behaviors characteristic of a phase-change material (PCM). The TIM 118 in the form of a PCM may trap air between the textured surface 204 and the TIM, thereby creating air voids. The particles 210, which displace as the TIM 118 heats, cools, and/or changes phases, move to displace the air voids (e.g., bubbles) into the grooves 206 and out from between the facing flat surfaces of the IC die 112 and heat spreader 122, which improves heat transfer between the IC die 112 and heat spreader 122, and ultimately improves the performance and reliability of the chip package 142.

Returning to FIG. 1, the thermally conductive heat spreader 122 has a surface area that is generally larger than the plan area of the IC die 112 so that the area available for thermally conductive contact and heat transfer is greater between the heat spreader 122 and the heat sink assembly 102 than between the heat spreader 122 and the IC die 112. The increase in surface area on the heat sink assembly-side of the conductive heat spreader 122 promotes the rate of heat transfer between the IC die 112 and the heat sink assembly 102 through the conductive heat transfer path 140, thus allowing higher performing IC dies to be utilized without exceeding thermal budgets as compared to conventional designs.

The conductive heat spreader 122 is clamped, or otherwise urged against the IC die 112. The force between the conductive heat spreader 122 and the IC die 112 may be generated in any suitable manner. In the example depicted in FIG. 1, a biasing member 152 is utilized to urge the conductive heat spreader 122 against the IC die 112 independent of the force utilized to urge the conductive heat spreader 122 against the heat sink assembly 102. In one example, the biasing member 152 includes a fastener 156 and a spring 154. The spring 154 is disposed between a head or other protrusion of the fastener 156 and the PCB 116. The opposite end of the fastener 156 is engaged with a threaded hole formed in the conductive heat spreader 122. When the fastener 156 is tightened to move the head of the fastener 156 towards the conductive heat spreader 122, the spring 154 is compressed and thus generates a force to urge the PCB 116 towards the conductive heat spreader 122, which consequently causes the IC die 112 to be urged against the conductive heat spreader 122 with the same force.

Optionally, a thermal gap-filling contact pad 150 may be disposed in the conductive heat transfer path 140 defined between the heat spreader 122 and the heat sink assembly 102 to promote heat transfer. The thermal gap-filling contact pad 150 is generally a compressive material having a thermal conductivity greater than about 5 W/m-K (as determined by ASTM D5470). Exemplary thermal gap-filling contact pads 150 are available from Laird Technologies, Inc., and Parker Chomerics, among others. Alternatively, TIM may also be utilized between between the heat spreader 122 and the heat sink assembly 102 in place of, or in addition to the contact pad 150.

The conductive heat spreader 122 is also clamped, or otherwise urged against the heat sink assembly 102. The force between the conductive heat spreader 122 and the heat sink assembly 102 may be generated in any suitable manner. In the example depicted in FIG. 1, a biasing member 134 is utilized to urge the PCB 116 towards the heat sink assembly 102. As the conductive heat spreader 122 is disposed between the PCB 116 and the heat sink assembly 102, the PCB 116 consequently urges the heat spreader 122 against the heat sink assembly 102. In one example, the biasing member 134 includes a fastener 138 and a spring 136. The spring 136 is disposed between a head or other protrusion of the fastener 138 and the PCB 116. The opposite end of the fastener 138 is engaged with a threaded hole formed in the conductive heat spreader 122. When the fastener 138 is tightened to move the head of the fastener 138 towards the heat sink assembly 102, the spring 136 is compressed and thus generates a force to urge the PCB 116 towards the heat sink assembly 102, which consequently causes the conductive heat spreader 122 to be urged against the heat sink assembly 102 with the same force.

The heat sink assembly 102 is generally fabricated from a thermally conductive material, such as aluminum, stainless steel, copper or other material suitable for drawing heat away from the IC die 112. The heat sink assembly 102 also includes at least one or more passive cooling elements, such as at least one heat pipe 124 and/or fins 126. In the example depicted in FIG. 1, the heat sink assembly 102 includes a base plate 120 in which the one or more heat pipes 124 are embedded. As noted above, the base plate 120 is generally fabricated from a thermally conductive material, such as aluminum, stainless steel, copper or other suitable material. Although the example depicted in FIG. 1 illustrates a first heat pipe 124 disposed in the base plate 120 with a second heat pipe 124 shown in phantom, as may heat pipes 124 disposed in or on the base plate 120 as desired.

In the example depicted in FIG. 1, the heat pipe 124 is disposed in a channel 144 formed in an interior surface 132 of the base plate 120. The channel 144 may be enclosed, such as in the form of a passage. Alternatively and as shown in FIG. 1, the channel 144 may be may be open, such as in the form of a groove. TIM, braising material, thermal grease or other heat transfer material may be utilized to fill the interstitial space defined between the channel 144 and the heat pipe 124 to enhance heat transfer between the heat pipe 124 to the base plate 120.

The heat pipe 124 includes a first end 146 that is disposed directly under or even in contact with the heat spreader 122. A second end 148 of the heat pipe 124 is disposed laterally offset from the lateral extends of the IC die 112. In the example depicted in FIG. 1, the second end 148 of the heat pipe 124 is disposed laterally offset from the heat spreader 122. Thus, since the first end 146 of the heat pipe 124 is adjacent the heat spreader 122 and essentially at the end of the heat transfer path 140, the phase change material within the heat pipe 124 efficiently moves the heat transferred from the IC die 112 to the spreader 122 laterally away to cooler regions of the base plate 120 that are laterally spaced from the IC die 112. Thus, the passive cooling provided by the heat pipe 124 substantially increases the capacity of heat transfer away from the chip package 142, thereby allowing the use of a greater number, faster and more powerful electrical devices within the antenna assembly 100 without undesirably having to increase the foot print of the antenna assembly 100.

As mentioned above, the fins 126 also provide passive cooling to the heat sink assembly 102. The fins 126 are disposed on an exterior surface 130 of the base plate 120 that faces away from the interior surface 132 and the interior volume 108 of the antenna assembly 100. The fins 126 may be generally flat rectangular plates, corrugated, perforated or have another shape.

The fins 126 are formed from a metal or other highly thermally conductive material. For example, the fins 126 may be made stainless steel, aluminum, copper or other suitable material. The fins 126 may be cast with or machined as from a single mass of material with the base plate 120. Alternatively, the fins 126 may be braised, welded, fastened or otherwise secured to the base plate 120.

Figure 3:
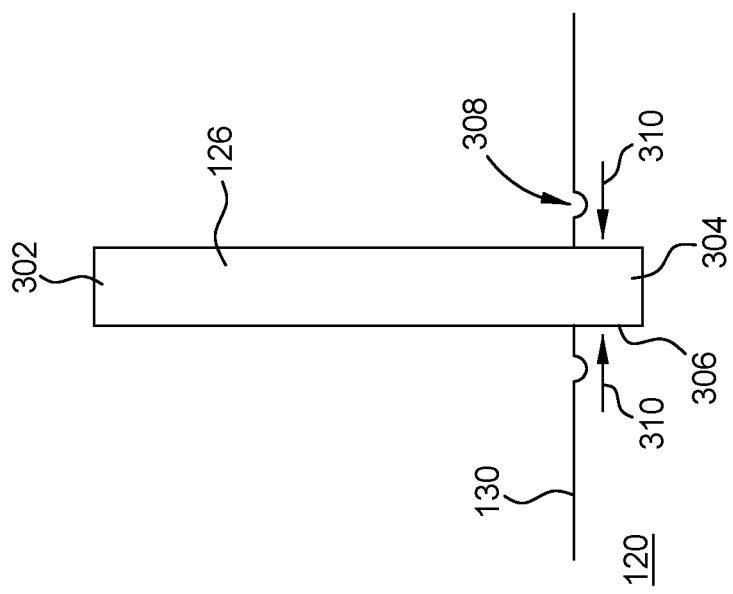
FIG. 3 is an enlarged partial sectional view of a fin extending from a base plate of the heat sink assembly of FIG. 1.

FIG. 3 is a side view of one embodiment of a fin 126 secured to the base plate 120. The fin 126 includes a distal (first) end 302 and a proximal (second) end 304. The second end 304 is disposed and secured in a slot 306 formed in the surface 130 of the base plate 120. The second end 304 may be secured in the slot 306 by braising, welding, adhesive, press fit or by other suitable techniques. In the example depicted in FIG. 3, the second end 304 is swaged in the slot 306. To swage the second end 304 in the slot 306, the material on the surface 130 adjacent the slot 306 is displaced, for example by forming in impression 308 in the surface 130 immediately adjacent the slot 306. The impression 308 displaces the material of the base plate 120 as shown by arrows 310, thus squeezing the material of the base plate 120 intimately against the second end 304 of the fin 126. The compressive contact of the second end 304 of the fin 126 base intimately against the base plate 120 creates a superior heat transfer interface, that further enhances the ability of the heat sink assembly 102 to remove heat from the interior volume 108, and beneficially the IC die 112, and promotes increased performance and reliability of the antenna assembly 100.

Returning to FIG. 1, the fins 126 may optionally include surface area extenders 128. The surface area extenders 128 project from the fins 126. In one example, the surface area extenders 128 extend in a direction that is within 45 degrees of perpendicular to a direction that the fin 126 extends from the base plate 120. The surface area extenders 128 are formed from a metal or other highly thermally conductive material. For example, the surface area extenders 128 may be made stainless steel, aluminum, copper or other suitable material. The surface area extenders 128 may be formed from a single mass of material with the fins 126, for example by skiving. Alternatively, the surface area extenders 128 may be braised, welded, fastened or otherwise secured to the fins 126.

In one embodiment, the surface area extenders 128 are in the form of plates. The plates may be flat, corrugated, perforated, hollow, or have another suitable shape. One example of the surface area extenders 128 is detailed below with reference to FIGS. 4-6.

Figure 4:
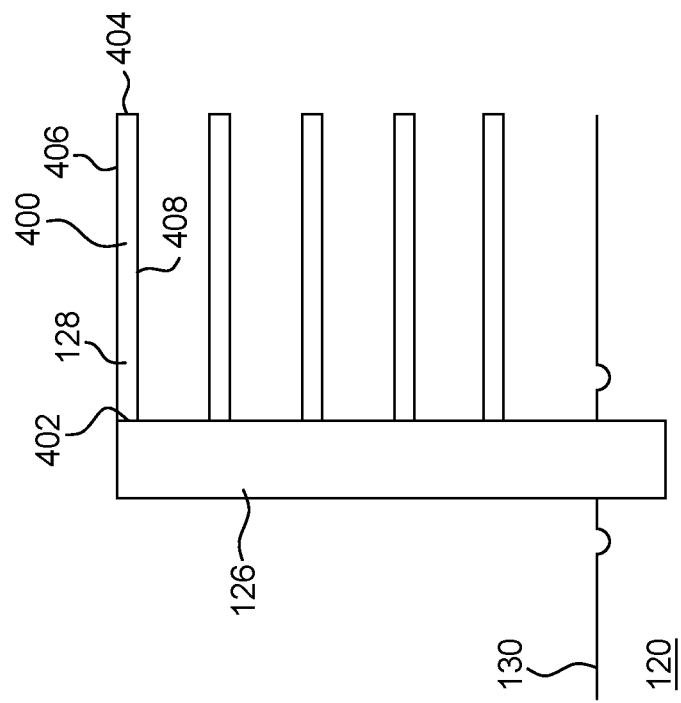
FIG. 4 is a side view of one example of a fin having a plurality of surface area extenders.

FIG. 4 is a side view of one example of a fin 126 having a plurality of surface area extenders 128 coupled thereto. Each surface area extender 128 is in the form of a hollow plate 400. The plate 400 may have rectangular plan area, or have another shape. A first end 402 of the plate 400 is coupled to the fin 126, for example by braising which promotes heat transfer across the fin-extender interface. A second end 404 of the fin 126 is disposed opposite the first end 402. The plate 400 also has a first side 406 and an opposing second side 408.

Figure 5:
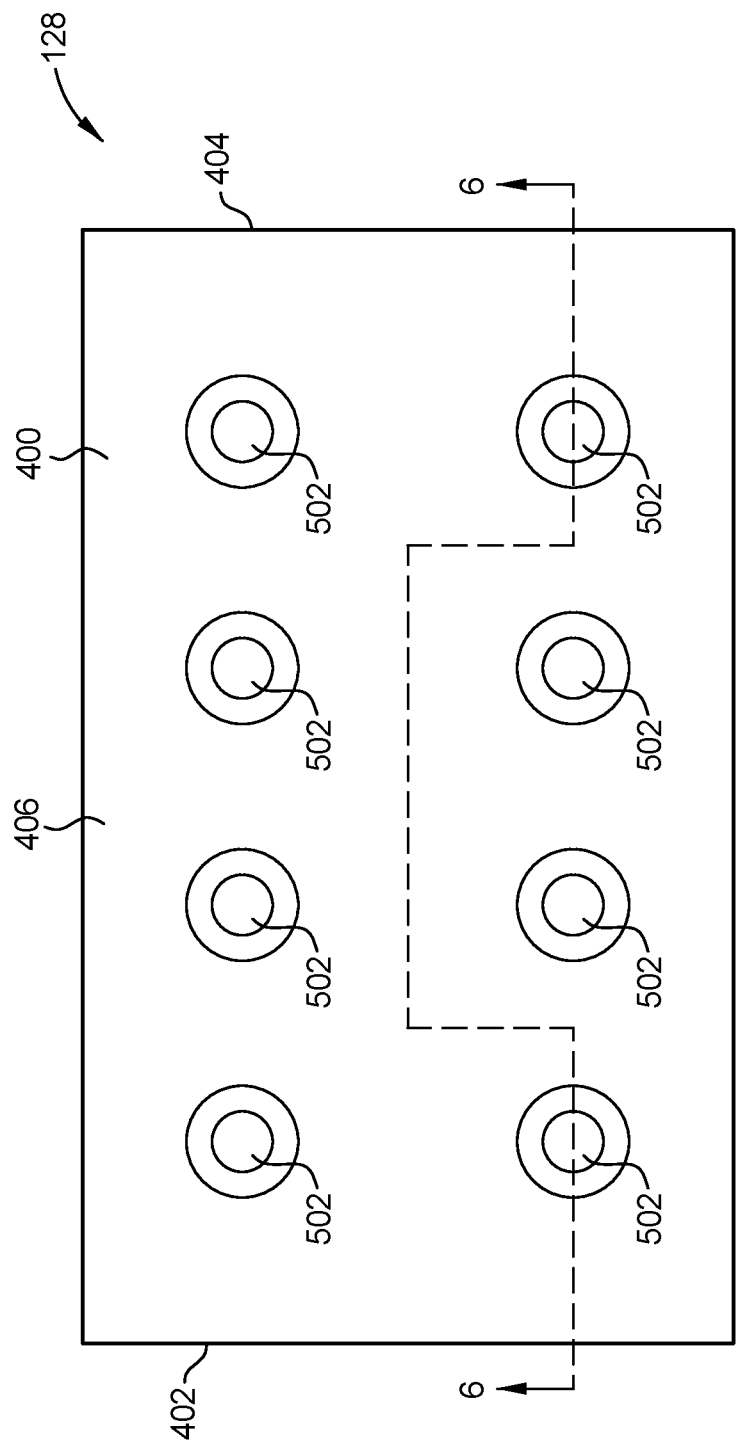
FIG. 5 is a top view of one example of a surface area extender in the form of a hollow plate.
Figure 6:
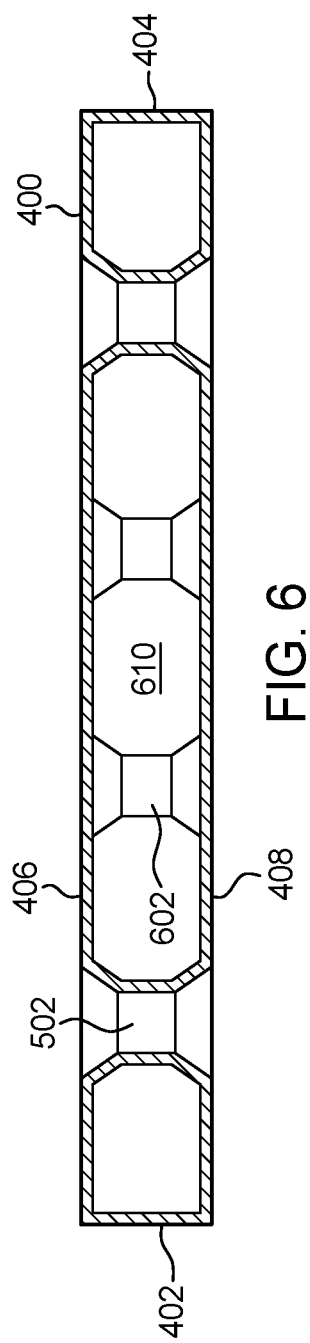
FIG. 6 is a sectional view of the hollow plate taken along section line 6-6 illustrated in FIG. 5.

Referring additionally to the plan view of FIG. 5 and the sectional view of FIG. 6, the plate 400 includes a plurality of perforations 502 extending between the first and second sides 406, 408. The perforations 502 may be arranged in any suitable pattern. In the embodiment of FIG. 5, the perforations 502 are arranged to allow air passage between the plates 400, thus increasing heat transfer efficiency.

The plate 400 is additionally hollow, forming a cavity 610. The cavity 610 is interrupted by tubes 602 through which the perforations 502 are formed such that the cavity 610 remains sealed. The cavity 610 may be filled with a heat conducting or phase change material to further enhance heat dissipation through the plates 400 and fins 126, and away from the heat sink assembly 102, thus increasing the cooling capacity of the heat sink assembly 102 and allowing higher performing and high density electronic devices as part of the antenna circuit board 110 and chip packages 142 without the need for increasing the size of the antenna assembly 100.

Figure 7:
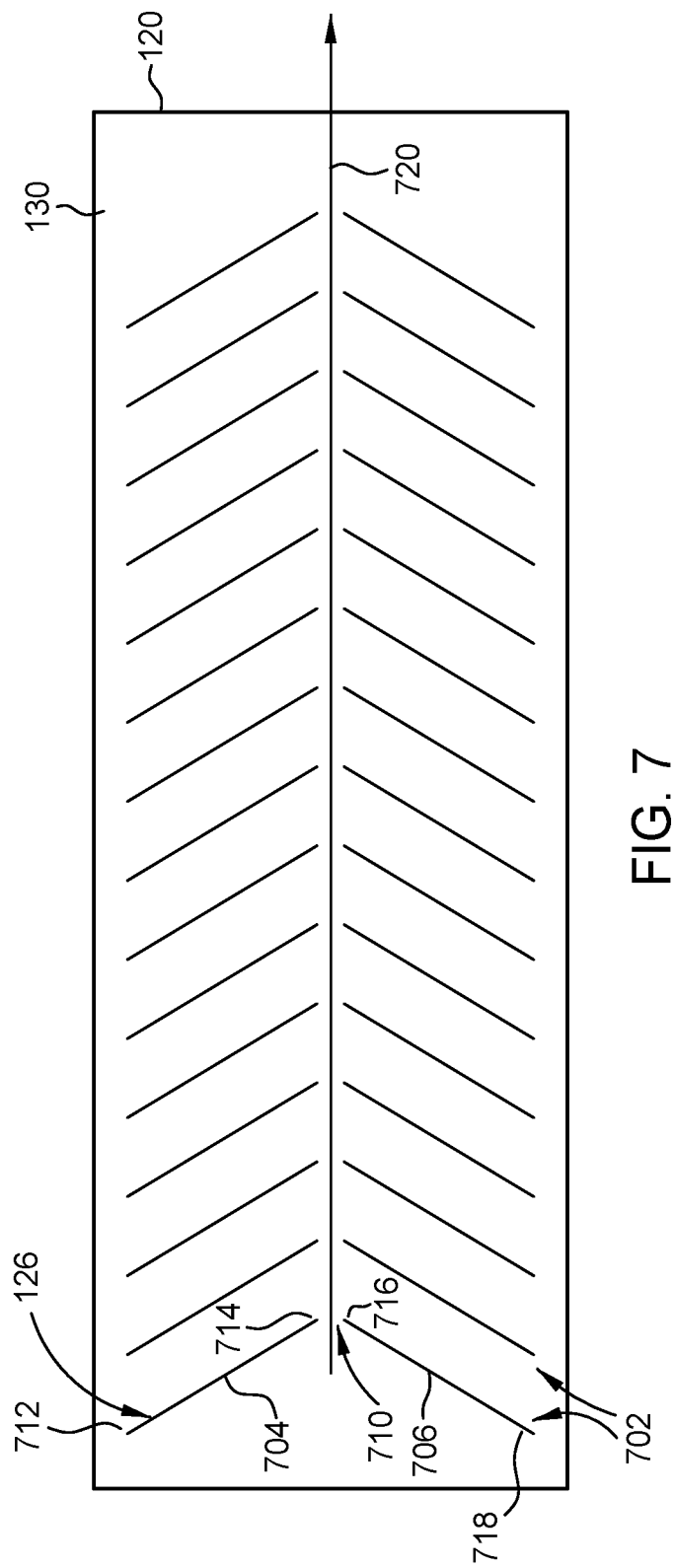
FIG. 7 is a side view of one example of the heat sink assembly having an exemplary arrangement of heat transfer fins.

FIG. 7 is a side view of the exterior surface 103 of the heat sink assembly 102 of the antenna assembly 100 illustrating one exemplary arrangement of the fins 126. The fins 126 in FIG. 7 are not shown with surface area extenders 128, but surface area extenders 128 may also be utilized as described above. Moreover, the arrangement of the fins 126 in FIG. 7 is exemplary of one embodiment that provides enhanced heat transfer, and other arrangement of the fins 126 are contemplated.

In the example of FIG. 7, the fins 126 are arranged in a plurality of chevron-shaped rows 702. The chevron-shaped rows 702 may be equally spaced, have a repetitive pattern or have other geometry. Each fin 126 comprising one of the rows 702 includes a first section 704 spaced apart from a second section 706. The sections 704, 706 form the opposite sides of the chevron shape. In one example, the first section 704 is the mirror image of the second section 706. The sections 704, 706 have a passage 710 defined therebetween. The passage 710 may be a tunnel, groove or other gap formed between the sections 704, 706 of the fin 126.

In one example, the first section 704 includes an outer end 712 and an inner end 714. Similarly, the second section 706 includes an outer end 718 and an inner end 716. The inner ends 714, 716 are disposed adjacent each other and are separated to form the passage 710. The passages 710 of adjacent fins 126 forming the rows 702 defined an air channel (illustrated by arrow 720). The chevron shape of the fins 126, in conjunction with the passage 710 formed at the vertices of the chevrons, functions to displace heated air from the center of the chevrons toward the outer ends 712, 718 of the fins 126, while drawing cooler air into the center of the chevrons through the air channel 720 formed by the passages 710. The air movement created by the chevron-shaped rows 702 of fins 126 further functions to increase the rate of heat transfer from the heat sink assembly 102, which as a corresponding improvement to the performance, speed, and reliability of the antenna assembly 100, thus allowing more powerful and faster performing components without a corresponding increase in size, cost or need for incorporation of active cooling elements.

While the foregoing is directed to embodiments of the present invention, other and further embodiments of the invention may be devised without departing from the basic scope thereof, and the scope thereof is determined by the claims that follow.

What is claimed is:

1. An antenna assembly comprising:
   a heat sink assembly having an interior side and an exterior side;
   an antenna array;
   an antenna circuit board including at least one integrated circuit (IC) die, the IC die having a conductive primary heat dissipation path to the interior side of the heat sink assembly;
   a heat spreader disposed between the interior side of the heat sink assembly and the IC die;
   a first plurality of springs urging a first side of the heat spreader away from the interior side of the heat sink assembly and against the IC die;
   a second plurality of springs urging a second side of the heat spreader against the heat sink assembly; and
   a radome coupled to the heat sink assembly, the radome enclosing the antenna circuit board and the antenna array between the radome and the heat sink assembly, wherein heat sink assembly comprises:
   a metal base plate; and
   at least a first heat pipe embedded with the metal base plate, the first heat pipe disposed between the metal base plate and the IC die.

2. The antenna assembly of claim 1, wherein a first side of the base plate forms the exterior side of the heat sink assembly, and wherein the first side of the base plate further comprises a plurality of fins.

3. The antenna assembly of claim 2, wherein the plurality of fins are swaged in slots formed on the first side of the base plate.

4. The antenna assembly of claim 2, wherein the plurality of fins are arranged in multiple chevron-shaped rows.

5. The antenna assembly of claim 4, wherein sides of each chevron are separated to form an air channel extending though each of the chevron-shaped rows.

6. The antenna assembly of claim 2, wherein at least a first fin of the plurality of fins is corrugated.

7. The antenna assembly of claim 2, wherein at least a first fin of the plurality of fins further comprises:
   a thermally conductive plate extending from the first fin towards a neighboring fin of the plurality of fins.

8. The antenna assembly of claim 7, wherein the thermally conductive plate further comprises:
   a fluid captured within the thermally conductive plate.

9. The antenna assembly of claim 7, wherein the thermally conductive plate further comprises:
   a plurality of holes formed through the thermally conductive plate.

10. The antenna assembly of claim 1, wherein an interior surface of the base plate further comprises:
    a plurality of grooves formed in a region of the base plate directly over the IC die.

11. The antenna assembly of claim 10 further comprising:
    thermal interface material disposed in contact with at least some of the plurality of grooves formed in the base plate and the IC die, the thermal interface material having suspended conductive particles.

12. An antenna assembly comprising:
    a heat sink assembly having an interior side and an exterior side;
    an antenna array;
    an antenna circuit board including at least one integrated circuit (IC) die, the IC die having a conductive primary heat dissipation path to the interior side of the heat sink assembly;
    a heat spreader disposed between the interior side of the heat sink assembly and the IC die;
    a first plurality of springs urging a first side of the heat spreader away from the interior side of the heat sink assembly and against the IC die;
    a second plurality of springs urging a second side of the heat spreader against the heat sink assembly; and
    a radome coupled to the heat sink assembly, the radome enclosing the antenna circuit board and the antenna array between the radome and the heat sink assembly, wherein heat sink assembly comprises:
    a metal base plate;
    a first heat pipe and a second heat pipe embedded with the metal base plate, the first heat pipe and the second heat pipe each having an end disposed between the metal base plate and the IC die; and
    a plurality of fins extending from a first side of the base plate that forms the exterior side of the heat sink assembly, the plurality of fins arranged in multiple chevron-shaped rows arranged to form an air channel passing through at least two adjacent chevron-shaped rows.

13. The antenna assembly of claim 12, wherein the plurality of fins are swaged in slots formed on the first side of the base plate.

14. The antenna assembly of claim 12 further comprising:
a plurality of thermally conductive plates extending from the plurality of fins.

15. The antenna assembly of claim 14, wherein a first plate of the plurality of thermally conductive plates further comprises:
a fluid captured within the first plate.

16. The antenna assembly of claim 15, wherein the first plate further comprises:
a plurality of holes formed through the first plate.

17. The antenna assembly of claim 12, wherein an interior surface of the base plate further comprises:
a plurality of grooves formed in a region of the base plate directly over the IC die.

18. The antenna assembly of claim 17 further comprising:
thermal interface material disposed in contact with at least some of the plurality of grooves formed in the base plate and the IC die, the thermal interface material having suspended conductive particles.

19. An antenna assembly comprising:
a heat sink assembly having an interior side and an exterior side;
an antenna array;
an antenna circuit board including at least one integrated circuit (IC) die, the IC die having a conductive primary heat dissipation path to the interior side of the heat sink assembly;
a heat spreader disposed between the interior side of the heat sink assembly and the IC die;
a first plurality of springs urging a first side of the heat spreader away from the interior side of the heat sink assembly and against the IC die;
a second plurality of springs urging a second side of the heat spreader against the heat sink assembly;
a radome coupled to the heat sink assembly, the radome enclosing the antenna circuit board and the antenna array between the radome and the heat sink assembly, wherein heat sink assembly comprises:
a metal base plate having a plurality of grooves formed in a region of the base plate directly over the IC die;
a first heat pipe and a second heat pipe embedded with the metal base plate, the first heat pipe and the second heat pipe each having an end disposed between the metal base plate and the IC die;
a plurality of fins extending from a first side of the base plate that forms the exterior side of the heat sink assembly, the plurality of fins arranged in multiple chevron-shaped rows arranged to form an air channel passing through multiple adjacent chevron-shaped rows; and
a plurality of thermally conductive plates extending from the plurality of fins; and
thermal interface material disposed in contact with at least some of the plurality of grooves formed in the base plate and the IC die, the thermal interface material having suspended conductive particles.

20. An antenna assembly comprising:
a heat sink assembly having an interior side and an exterior side;
an antenna array;
an antenna circuit board including at least one integrated circuit (IC) die, the IC die having a conductive primary heat dissipation path to the interior side of the heat sink assembly;
a heat spreader disposed between the interior side of the heat sink assembly and the IC die;
a first plurality of springs urging a first side of the heat spreader away from the interior side of the heat sink assembly and against the IC die;
a second plurality of springs urging a second side of the heat spreader against the heat sink assembly; and
a radome coupled to the heat sink assembly, the radome enclosing the antenna circuit board and the antenna array between the radome and the heat sink assembly.

21. The antenna assembly of claim 20, wherein the radome further comprises:
a metal base plate; and
at least a first heat pipe embedded with the metal base plate, the first heat pipe having a first end sandwiched between the metal base plate and the heat spreader, the first heat pipe having a second end disposed laterally outward of the heat spreader.

* * * * *